(12) United States Patent
    Nozaki

(10) Patent No.: US 10,581,218 B2
(45) Date of Patent: Mar. 3, 2020

(54) SEMICONDUCTOR LIGHT EMITTING DEVICE

(71) Applicant: Panasonic Corporation, Osaka (JP)

(72) Inventor: Shinichiro Nozaki, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 15/986,153

(22) Filed: May 22, 2018

(65) Prior Publication Data

US 2018/0269650 A1 Sep. 20, 2018

Related U.S. Application Data

(63) Continuation of application No. PCT/JP2016/004864, filed on Nov. 11, 2016.

(30) Foreign Application Priority Data

Dec. 9, 2015 (JP) .................. 2015-239820

(51) Int. Cl.
    *H01S 5/022* (2006.01)
    *H01S 5/40* (2006.01)
    (Continued)

(52) U.S. Cl.
    CPC ...... *H01S 5/02236* (2013.01); *H01S 5/02469* (2013.01); *H01S 5/4025* (2013.01);
    (Continued)

(58) Field of Classification Search
    CPC ...... H01S 5/024; H01S 5/022; H01S 5/02236; H01S 5/02469; H01S 5/4018; H01S 5/3425; H01S 5/02484; H01S 5/34
    (Continued)

(56) References Cited

U.S. PATENT DOCUMENTS 5,887,012 A    3/1999   Yamada
6,654,399 B1  11/2003   Kimura et al.
                (Continued)

FOREIGN PATENT DOCUMENTS

JP    01-181490    *  7/1989   ............... H01S 3/18
JP     1-181490       7/1989
                (Continued)

OTHER PUBLICATIONS

International Search Report of PCT application No. PCT/JP2016/004864 dated Dec. 13, 2016.

*Primary Examiner* — Tuan N Nguyen
(74) *Attorney, Agent, or Firm* — McDermott Will & Emery LLP

(57) ABSTRACT

A semiconductor light emitting device includes a mount section having an insulating property connected to a heat sink, a plurality of semiconductor laser elements disposed on the mount section, and a heat radiation block having an insulating property disposed on the plurality of semiconductor laser elements. A first wiring made of a metal is disposed on an upper surface of the mount section, and a second wiring made of a metal is disposed on a lower surface of the heat radiation block, a part of the second wiring being electrically connected to the first wiring. By electrically connecting the first wiring and the second wiring to each of the plurality of semiconductor laser elements, the plurality of semiconductor laser elements are connected in series, and have a same polarity with each other at a side that each of the plurality of semiconductor laser elements is connected to the first wiring.

18 Claims, 12 Drawing Sheets

(51) Int. Cl.
  *H01S 5/024* (2006.01)
  *H01S 5/34* (2006.01)
  *H01S 5/22* (2006.01)
  *H01S 5/343* (2006.01)

(52) U.S. Cl.
  CPC .. *H01S 5/4031* (2013.01); *H01L 2224/16225* (2013.01); *H01L 2224/48091* (2013.01); *H01L 2224/48137* (2013.01); *H01S 5/02212* (2013.01); *H01S 5/02272* (2013.01); *H01S 5/02276* (2013.01); *H01S 5/02484* (2013.01); *H01S 5/22* (2013.01); *H01S 5/3425* (2013.01); *H01S 5/34333* (2013.01); *H01S 5/4018* (2013.01)

(58) Field of Classification Search
  USPC .......................................................... 372/36
  See application file for complete search history.

(56) References Cited

U.S. PATENT DOCUMENTS

| | | | | |
|---|---|---|---|---|
| 7,655,953 | B2* | 2/2010 | Inoue | B82Y 20/00 257/89 |
| 2006/0045147 | A1* | 3/2006 | Sin | H01S 5/0425 372/20 |
| 2007/0181908 | A1* | 8/2007 | Otremba | H01L 23/49575 257/107 |
| 2011/0051758 | A1* | 3/2011 | Krejci | H01S 5/02272 372/34 |
| 2012/0044965 | A1* | 2/2012 | Akiyoshi | B82Y 20/00 372/50.12 |
| 2012/0119346 | A1* | 5/2012 | Im | H01L 21/563 257/690 |
| 2012/0127371 | A1* | 5/2012 | Watanabe | G06T 5/007 348/687 |
| 2012/0146066 | A1* | 6/2012 | Tischler | H01L 27/156 257/89 |
| 2013/0069107 | A1* | 3/2013 | Nozaki | H01L 33/22 257/103 |
| 2013/0135883 | A1* | 5/2013 | Singer | H05K 1/0203 362/487 |
| 2014/0346659 | A1* | 11/2014 | Nakamura | H02M 7/003 257/704 |
| 2014/0347782 | A1* | 11/2014 | Fujita | B32B 18/00 361/301.4 |
| 2015/0023376 | A1* | 1/2015 | Yamanaka | H01S 5/02256 372/36 |

FOREIGN PATENT DOCUMENTS

| | | | | |
|---|---|---|---|---|
| JP | 8-046280 | | 2/1996 | |
| JP | 9-167878 | | 6/1997 | |
| JP | 2000-299533 | * | 10/2000 | .............. H01S 5/40 |
| JP | 2000-310679 | | 11/2000 | |
| JP | 2010-199274 | | 9/2010 | |
| WO | 2007/107782 | | 9/2007 | |

* cited by examiner

SEMICONDUCTOR LIGHT EMITTING DEVICE

RELATED APPLICATIONS

This application is a continuation of the PCT International Application No. PCT/JP2016/004864 filed on Nov. 11, 2016, which claims the benefit of foreign priority of Japanese patent application No. 2015-239820 filed on Dec. 9, 2015, the contents all of which are incorporated herein by reference.

BACKGROUND

1. Technical Field

The present disclosure relates to a semiconductor light emitting device, and in particular to a semiconductor light emitting device using a high output semiconductor laser, a super luminescent diode, or the like which emit a visible light having wavelength ranging from blue-violet to red.

2. Description of the Related Art

Recently, development of a high output semiconductor laser device as a light source for providing high intensity lighting has been actively performed. For providing a high output from the semiconductor laser device, a structure has been examined that disperses, by using a plurality of semiconductor laser elements, load and heat generation of each of the semiconductor laser elements to improve reliability of the semiconductor laser element. A structure of a semiconductor laser device that simultaneously drives a plurality of semiconductor laser elements disclosed in, for example, Unexamined Japanese Patent Publication No. 9-167878 has been examined.

The structure of the conventional semiconductor light emitting device disclosed in Unexamined Japanese Patent Publication No. 9-167878 will be described with reference to FIG. 19. The conventional semiconductor light emitting device is composed of a plurality of semiconductor laser elements in which n-InP clad layer 6, active layer 7, p-InP clad layer 8, p-InP current block layer 9, n-InP current block layer 10, p$^+$-InP cap layer 11 are laminated on semiconductor insulating substrate 5 in this order. The semiconductor laser elements are electrically insulated with each other by element separation grooves 12 each reaching semiconductor insulating substrate 5. In the meanwhile, the semiconductor laser elements, which are electrically insulated, has a structure electrically connecting, by wire 3, n-side electrode 14 provided on n-InP clad layer 6 and p-side electrode 13 provided on p$^+$-InP cap layer 11. Thus, a plurality of the semiconductor laser elements are connected in series.

SUMMARY

A semiconductor light emitting device according to the present disclosure includes a mount section having an insulating property connected to a heat sink, a plurality of semiconductor laser elements disposed on the mount section, and a heat radiation block having an insulating property disposed on the plurality of semiconductor laser elements. A first wiring made of a metal is formed on an upper surface of the mount section, and a second wiring made of a metal is formed on a lower surface of the heat radiation block, a part of the second wiring being electrically connected to the first wiring. By electrically connecting the first wiring and the second wiring to each of the plurality of semiconductor laser elements, the plurality of semiconductor laser elements are connected in series, and have a same polarity with each other at a side that each of the plurality of semiconductor laser elements is connected to the first wiring.

According to the semiconductor light emitting device of the present disclosure, the plurality of semiconductor laser elements can be electrically connected in series by using the mount section and the heat radiation block on which the respective metal wirings are formed. Thus, it is possible to avoid concentration of load to one semiconductor laser element, which is remarkable in a nitride semiconductor light emitting element. Additionally, by connecting the plurality of semiconductor laser elements to the mount section at respective sides having the same polarity with each other, an active layer, which generates large heat, can be disposed so as to be closer to a heat sink in each of the plurality of semiconductor laser elements. Thus, heat generated in the plurality of semiconductor laser elements is efficiently dispersed to the heat sink. Therefore, it is possible to suppress temperature increase of the semiconductor laser elements, so that reliability of the semiconductor light emitting device can be improved.

The present disclosure can provide a semiconductor light emitting device having high reliability even in high output operation.

DETAILED DESCRIPTION OF EMBODIMENT

Figure 1:
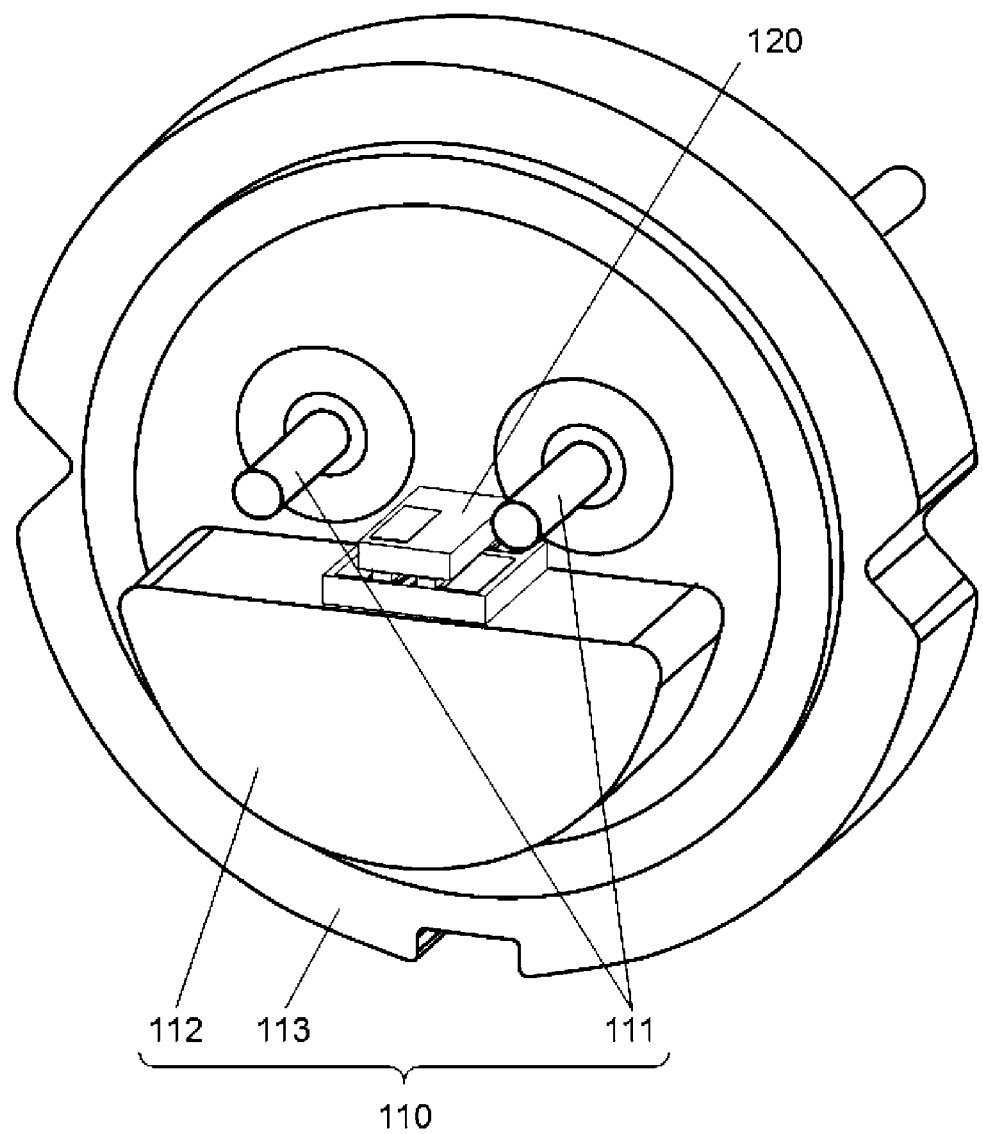
FIG. 1 is a perspective view illustrating a semiconductor light emitting device according to a first exemplary embodiment disposed in a semiconductor package.

Before describing exemplary embodiments of the present disclosure, problems in a conventional semiconductor light emitting device will be simply described. There is a problem described below when a semiconductor light emitting device of high output and high reliability is provided by using a structure disclosed in Unexamined Japanese Patent Publication No. 9-167878.

First, when insulation between semiconductor laser elements is achieved by an element separation groove as described in Unexamined Japanese Patent Publication No. 9-167878, an insulating substrate needs to be used. Accordingly, for example, in a case of a nitride-based semiconductor laser element having a structure that an n-type semiconductor substrate is used for flowing current to a semiconductor laser element via the n-type semiconductor substrate, it is difficult to produce the same structure as the structure disclosed in Unexamined Japanese Patent Publication No. 9-167878.

Also, since the semiconductor laser elements are connected by a wire, when implementation is performed, a junction up implementation is performed in which a substrate side is joined to a heat sink. Accordingly, an active layer which mostly generates heat is located away from the heat sink, and thus the temperature of each semiconductor laser element disadvantageously increases. As a result, reliability of the semiconductor laser elements decline because of the increase in temperature of the active layer in operation. Furthermore, since the semiconductor laser elements are connected by a wire, a distance between the semiconductor laser elements increases, so that an interval between respective luminous points disadvantageously become wide.

On the other hand, when the semiconductor laser elements are connected in parallel, the inventors of the present disclosure have found a problem described below. By connecting the semiconductor laser elements in parallel, operating current of the semiconductor laser device becomes high. Thus, resistance heating at a joint part of a wire or an electrode increases, so that disconnection of the wire or deterioration of the electrode may disadvantageously occurs.

Furthermore, a p-type semiconductor layer in the nitride-based semiconductor laser element generally has large activation energy, so that its resistance is largely lowered due to increase in carrier density associated with temperature rise. Consequently, in the plurality of semiconductor laser elements connected in parallel, if there is variation or the like in electrode area or contact resistance, unevenness in temperature occurs between the plurality of semiconductor laser elements. When unevenness in temperature once occurs between the plurality of semiconductor laser elements, positive feedback that is (1) increase of current, (2) increase of heat generation, (3) lowering of resistance, and (4) further increase of current, is established in one of the semiconductor laser elements having a high temperature. Therefore, a load to the one semiconductor laser element acceleratively increases.

The present disclosure is conceived to solve the above problem, and provides a semiconductor light emitting device having high reliability also in high output operation.

Hereinafter, semiconductor light emitting devices according to exemplary embodiments of the present disclosure will be described with reference to the drawings.

First Exemplary Embodiment

Figure 2:
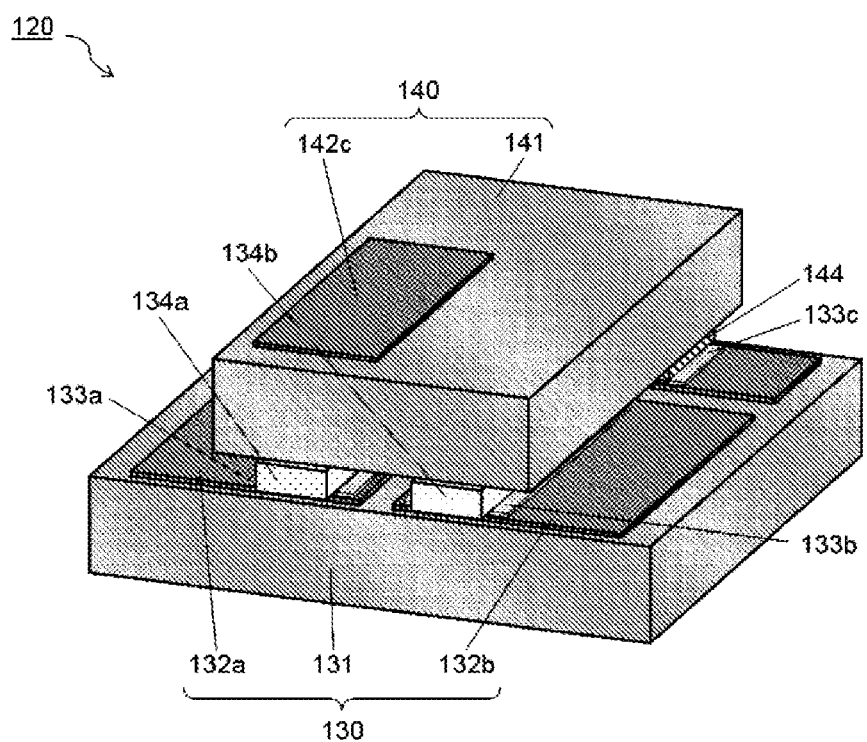
FIG. 2 is a perspective front side view illustrating the semiconductor light emitting device according to the first exemplary embodiment.
Figure 3:
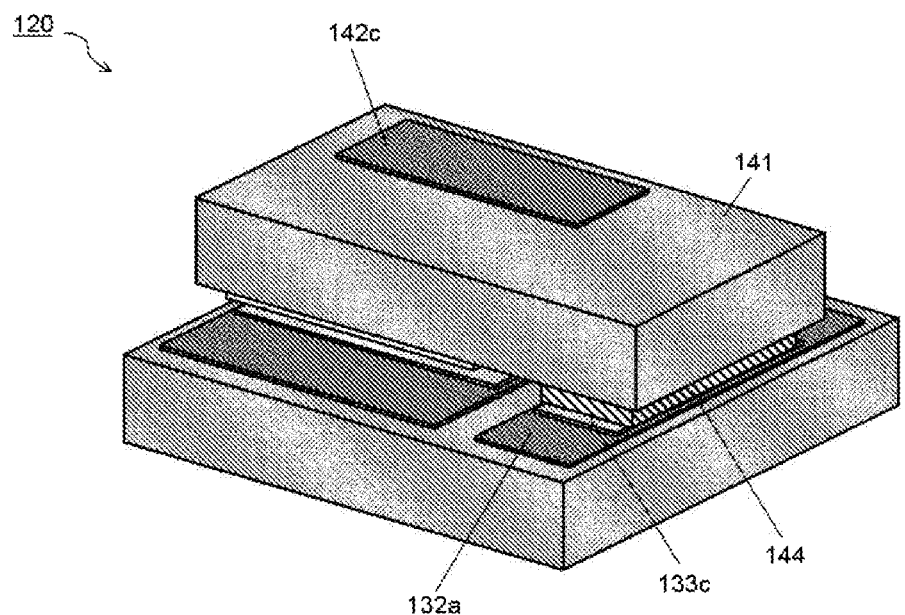
FIG. 3 is a perspective back side view illustrating the semiconductor light emitting device according to the first exemplary embodiment.
Figure 4:
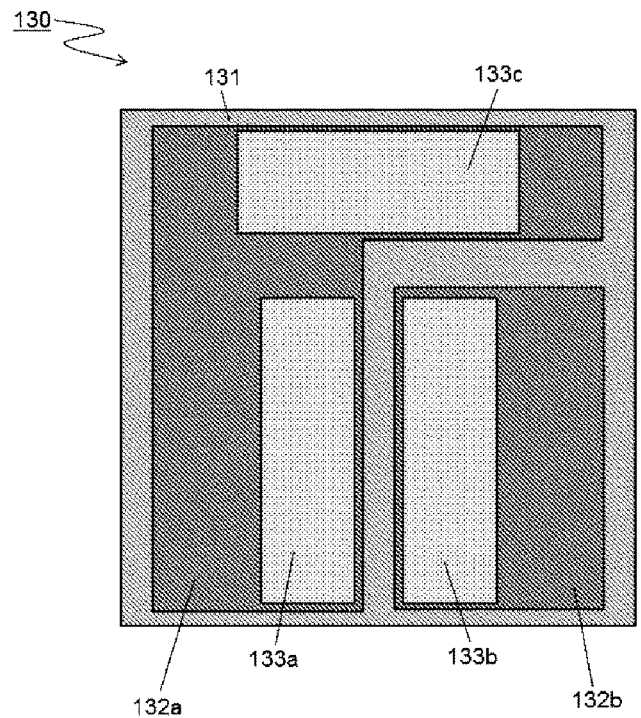
FIG. 4 is a top view illustrating a mount section according to the first exemplary embodiment.
Figure 5:
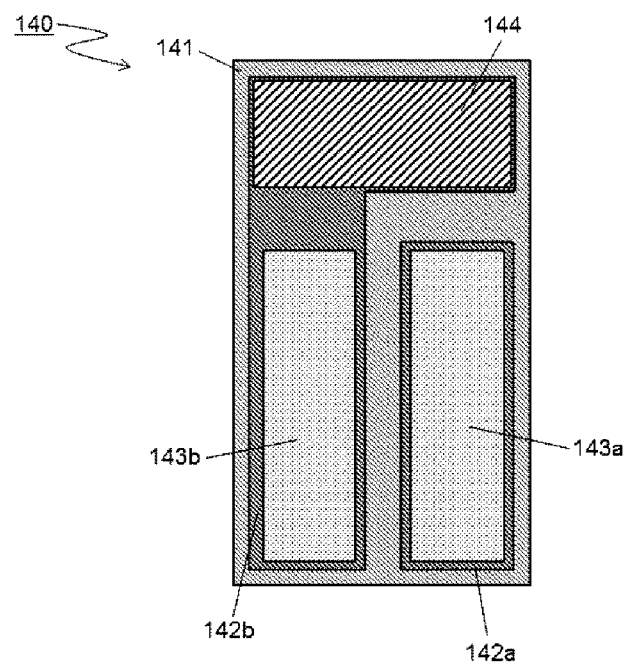
FIG. 5 is a bottom view illustrating a heat radiation block according to the first exemplary embodiment.

A structure of a semiconductor light emitting device according to a first exemplary embodiment will be described with reference to FIG. 1 to FIG. 10. FIG. 1 is a perspective view illustrating the semiconductor light emitting device according to the first exemplary embodiment disposed in a semiconductor package. FIG. 2 is a front side perspective view illustrating the semiconductor light emitting device according to the first exemplary embodiment, and FIG. 3 is a back side perspective view illustrating the semiconductor light emitting device according to the first exemplary embodiment. FIG. 4 is a top view illustrating a mount section according to the first exemplary embodiment, and FIG. 5 is a bottom view illustrating a heat radiation block according to the first exemplary embodiment.

As illustrated in FIG. 1, semiconductor light emitting device 120 is installed in semiconductor package 110. Semiconductor package 110 includes base 113 having a substantially circular plate shape, two lead pins 111 passing completely through base 113, and seat 112 projecting from base 113 and having a substantially half cylindrical shape. Semiconductor light emitting device 120 is implemented on seat 112. Lead pin 111 is made of a conductive material such as a metal, and electrically connected to semiconductor light emitting device 120 via a wire or the like, and supplies electric power to semiconductor light emitting device 120 from an outside of semiconductor package 110. Seat 112 is made of a material having high heat conductivity such as a metal, and functions as a heat sink that diffuses heat from semiconductor light emitting device 120 via an implementation surface with semiconductor light emitting device 120.

As illustrated in FIG. 2, FIG. 3, semiconductor light emitting device 120 has a structure in which two semiconductor laser elements (semiconductor laser element 134a, semiconductor laser element 134b) are sandwiched by mount section 130 and heat radiation block 140. Mount section 130 includes mount substrate 131 made of, for example, an insulating material such as SiC, AlN, or diamond, and mount wirings formed on an upper surface of mount substrate 131 and, for example, made of a material such as Au, Pt, or Ti (mount wiring 132a, mount wiring 132b). Heat radiation block 140 includes heat radiation block substrate 141 made of, for example, an insulating material such as SiC, AlN, or diamond, heat radiation block wirings (heat radiation block wiring 142a, heat radiation block wiring 142b described below) formed on a lower surface of heat radiation block substrate 141 and made of, for example, a metal such as Au, Pt, or Ti, and a heat radiation block wiring (heat radiation block wiring 142c) formed on the upper surface of heat radiation block substrate 141 and made of, for example, a metal such as Au, Pt, or Ti. Herein, a thickness of mount substrate 131 is preferably not less than 50 μm and not more than 500 μm, a width of mount substrate 131 is preferably not less than 500 μm and not more than 2000 μm, and a depth of mount substrate 131 is preferably not less than 500 μm and not more than 4000 μm. Also, a thickness of heat radiation block substrate 141 is preferably not less than 100 μm and not more than 500 μm, a width of heat radiation block substrate 141 is preferably not less than 500 µm and not more than 2000 µm, and a depth of heat radiation block substrate 141 is preferably not less than 500 µm and not more than 4000 µm. A film thickness of each of the mount wirings and the heat radiation block wirings is preferably not less than 50 µm and not more than 300 µm.

Wiring structures on the upper surface of mount section 130 and the lower surface of heat radiation block 140 will be described in detail with reference to FIG. 4, FIG. 5. As illustrated in FIG. 4, by patterning a metal layer formed on a surface (the upper surface) of mount substrate 131, mount wiring 132a having an L shape and mount wiring 132b having a rectangular shape are formed. Mount wiring 132a has an L shape whose width on a front side is small and whose width on a back side is large. Herein, a lower side in the drawing is the front side, and an upper side of the drawing is the back side. Mount solder layer 133a for joining semiconductor laser element 134a is formed on the front side of mount wiring 132a. Also, mount solder layer 133c for joining conductive post 144 (described below) is formed on the back side of the mount wiring 132a. Mount solder layer 133b for joining semiconductor laser element 134b is formed on mount wiring 132b. A length in a direction toward the back surface from the front surface of mount wiring 132b is shorter than mount wiring 132a having the L shape, and a part of mount wiring 132a is disposed on mount substrate 131 on the back side of mount wiring 132b.

Also, as illustrated in FIG. 5, by patterning a metal layer formed on a surface (the lower surface) of heat radiation block substrate 141, heat radiation block wiring 142a having a rectangular shape and heat radiation block wiring 142b having an L shape are formed. Heat radiation block wiring 142b has an L shape whose width on the front side is small and whose width on the back side is large. Herein, the lower side in the drawing is the front side, and the upper side of the drawing is the back side. Heat radiation block solder layer 143a for joining semiconductor laser element 134a is formed on heat radiation block wiring 142a. A length in a direction toward the back surface from the front surface of heat radiation block wiring 142a is shorter than heat radiation block wiring 142b having the L shape, and a part of heat radiation block wiring 142b is disposed on heat radiation block substrate 141 on the back side of heat radiation block wiring 142a. Heat radiation block solder layer 143b for joining semiconductor laser element 134b is formed on the front side of heat radiation block wiring 142b. Also, conductive post 144 is disposed on the back side of heat radiation block wiring 142b. Conductive post 144 is fixed to heat radiation block wiring 142b by plating heat radiation block wiring 142b.

As illustrated in FIG. 2, semiconductor laser element 134a and semiconductor laser element 134b are implemented on mount section 130 with their laser emission end surfaces being oriented toward the front side. Specifically, a lower surface of semiconductor laser element 134a is electrically connected to and mechanically fixed to mount wiring 132a by mount solder layer 133a. Also, a lower surface of semiconductor laser element 134b is electrically connected to and mechanically fixed to mount wiring 132b by mount solder layer 133b.

On the upper surface of mount section 130, semiconductor laser element 134a and semiconductor laser element 134b are disposed on the front side, and conductive post 144 is disposed on the back side. As illustrated in FIG. 3, conductive post 144 is electrically connected to and mechanically fixed to mount wiring 132a extending to the back side by mount solder layer 133c. Conductive post 144 may be a block made of a metal such as CU or Al, or may be a block made of an insulating material such as AlN or SiC on which a metal is coated.

Heat radiation block 140 is disposed on semiconductor laser element 134a and semiconductor laser element 134b, and heat radiation block wiring 142a and heat radiation block wiring 142b are respectively joined with semiconductor laser element 134a and semiconductor laser element 134b. Specifically, an upper surface of semiconductor laser element 134a is electrically connected to and mechanically fixed to heat radiation block wiring 142a by heat radiation block solder layer 143a. Also, an upper surface of semiconductor laser element 134b is electrically connected to and mechanically fixed to heat radiation block wiring 142b by heat radiation block solder layer 143b.

Also, on the lower surface of heat radiation block 140, semiconductor laser element 134a and semiconductor laser element 134b are disposed on the front side, and conductive post 144 is disposed on the back side. Conductive post 144 is electrically connected to and mechanically fixed to heat radiation block wiring 142b extending to the back side. This makes mount wiring 132a and heat radiation block wiring 142b be electrically connected via conductive post 144.

Also, heat radiation block wiring 142a is electrically connected to heat radiation block wiring 142c formed on the upper surface of heat radiation block substrate 141 via conductive via 145 (described below) passing completely through heat radiation block substrate 141.

Figure 6:
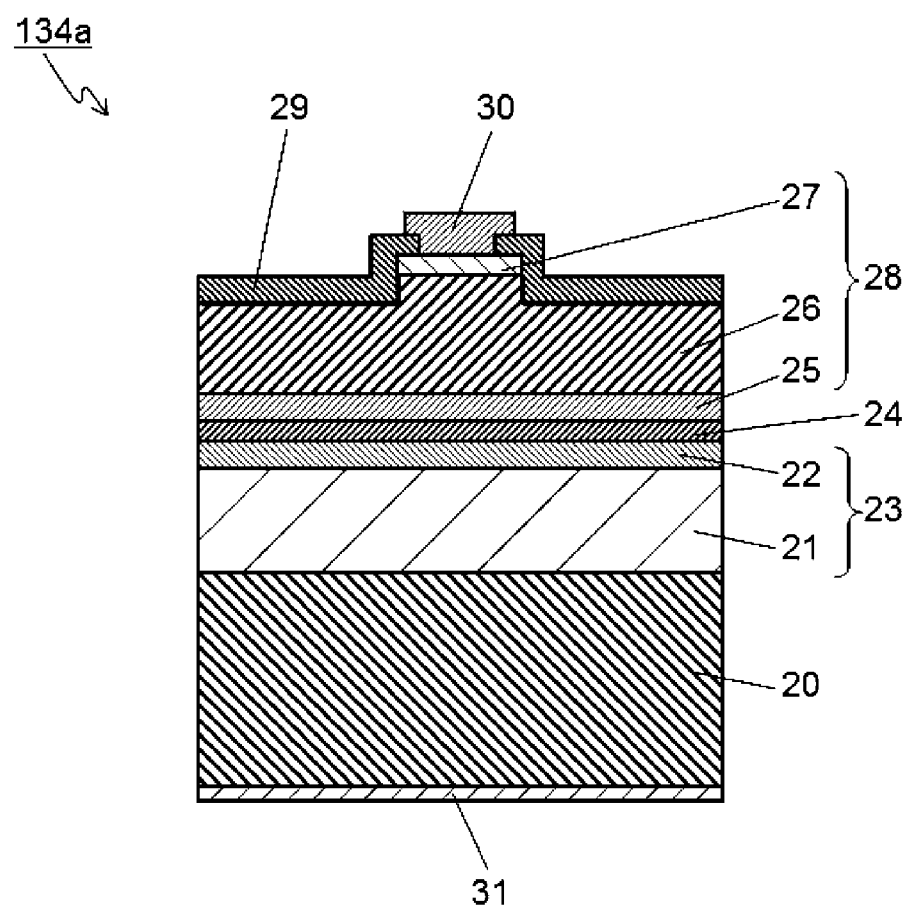
FIG. 6 is a front view illustrating a semiconductor laser element according to the first exemplary embodiment.

Next, structures of semiconductor laser element 134a and semiconductor laser element 134b will be described with reference to FIG. 6. FIG. 6 is a front view of the semiconductor laser element according to the first exemplary embodiment. Herein, semiconductor laser element 134a will be described as an example.

As illustrated in FIG. 6, semiconductor laser element 134a includes n-type layer 23 in which n-type clad layer 21 and n-type guide layer 22 are sequentially laminated on n-type semiconductor substrate 20, active layer 24 disposed on n-type layer 23, and p-type layer 28 disposed on active layer 24 in which p-type guide layer 25, p-type clad layer 26, and p-type contact layer 27 are sequentially laminated. Also, a stripe shaped protrusion is formed in p-type clad layer 26, and a p-type contact layer 27 is disposed on the protrusion. A ridge is constituted by the protrusion of p-type clad layer 26 and p-type contact layer 27. An upper surface of p-type clad layer 26 in which no protrusion is formed and side surfaces of the ridge are covered with current block layer 29. An opening is formed in current block layer 29 such that p-type contact layer 27 is exposed, and p-side electrode 30 is in ohmic contact with p-type contact layer 27 at the ridge by being provided with p-side electrode 30 on the opening. Also, n-side electrode 31 is formed on a lower surface of substrate 20. In this way, semiconductor laser element 134a is energized when a voltage is applied between p-side electrode 30 and n-side electrode 31, so that laser light is emitted. In this context, emission intensity becomes highest in active layer 24 at the lower side of the ridge due to a light confining effect or the like caused by the ridge structure. This portion is referred as a luminous point. The luminous point can be configured so as to be located not only at the center of the semiconductor laser element, but also at a portion shifted on one side by changing the position of the ridge.

When semiconductor laser element 134a is formed by using a nitride-based semiconductor material, GaN or GaN including Al or In can be used as the above-described semiconductor layer and semiconductor substrate. Note that, in order to yield the light confining effect in the stacking direction of the semiconductor layer, the materials are selected such that a refractive index of active layer 24 becomes higher than a refractive index of n-type layer 23 and a refractive index of p-type layer 28. Specifically, n-type semiconductor substrate 20 is made of GaN. For example, n-type clad layer 21 and n-type guide layer 22 are respectively made of AlGaN and GaN, and their film thicknesses are respectively 3 µm, 100 nm. Also, a composition of Al in AlGaN used in n-type clad layer 21 is about 3%. Active layer 24 has a quantum well structure in which a well layer of InGaN is surrounded by a barrier layer having a bandgap larger than that of the well layer, and can emit light having a desired wavelength by adjusting a composition of In. A thickness of the well layer is preferably not less than 3 nm and not more than 10 nm. P-type guide layer 25 and p-type clad layer 26 are respectively made of GaN and AlGaN, and their film thicknesses are respectively 100 nm, 500 nm. In this context, p-type clad layer 26 may be constituted by a superlattice of AlGaN and GaN. P-type contact layer 27 is made of GaN, and has a p-type dopant concentration higher than that of p-type clad layer 26. Also, a film thickness of p-type contact layer 27 is 5 nm.

In the above-described example, n-type layer 23 is disposed at a side facing the substrate, but p-type layer 28 may be disposed at the side facing the substrate.

Figure 7:
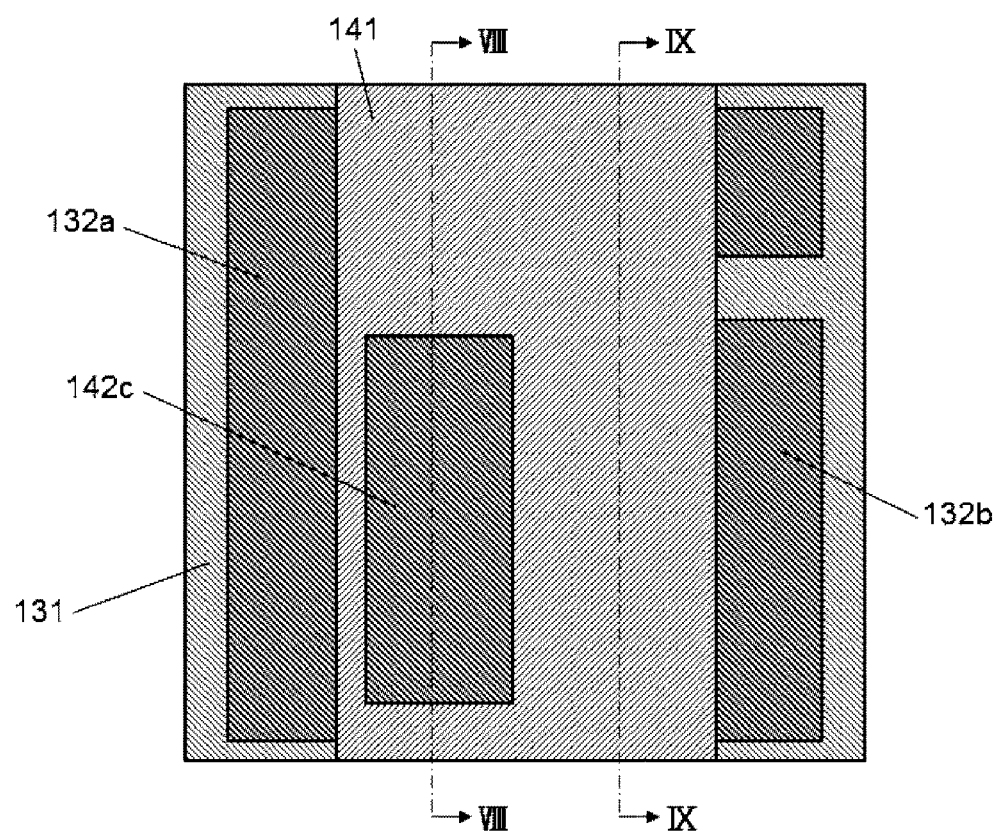
FIG. 7 is a top view illustrating the semiconductor light emitting device according to the first exemplary embodiment.
Figure 8:
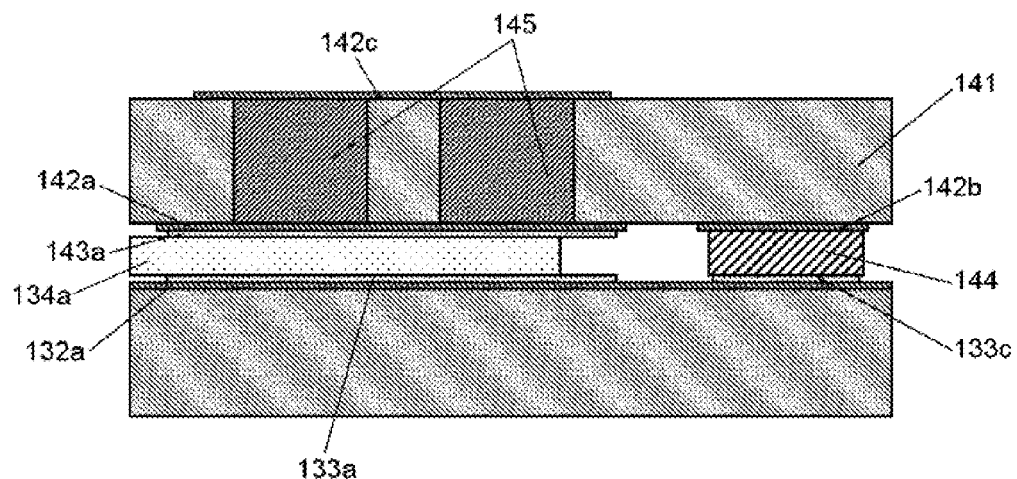
FIG. 8 is a cross sectional view taken along line VIII-VIII of FIG. 7.
Figure 9:
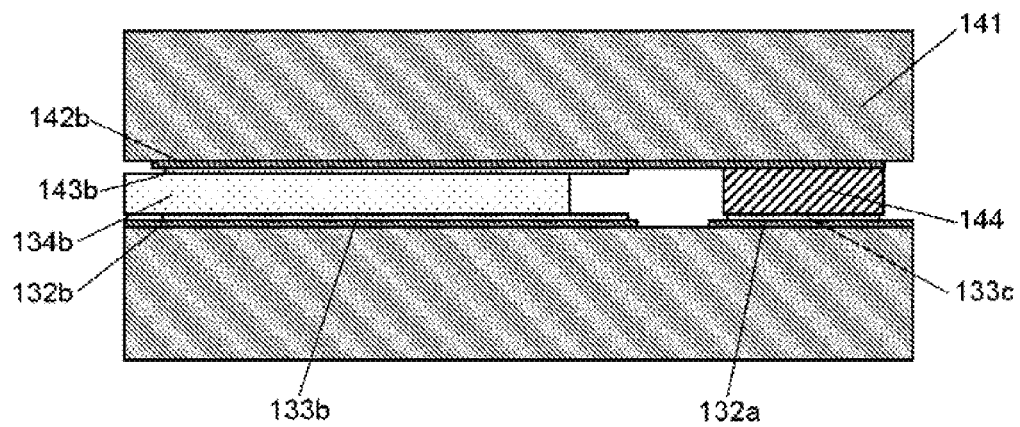
FIG. 9 is a cross sectional view taken along line IX-IX of FIG. 7.

Next, the structure of the semiconductor light emitting device according to the first exemplary embodiment will be described in further detail with reference to FIG. 7 to FIG. 10. FIG. 7 is a top view illustrating the semiconductor light emitting device according to the first exemplary embodiment. FIG. 8 is a cross sectional view taken along line VIII-VIII of FIG. 7, and FIG. 9 is a cross sectional view taken along line IX-IX of FIG. 7.

As illustrated in FIG. 7, heat radiation block substrate 141 is smaller than mount substrate 131 in a plan view, and a part of mount wiring 132a and a part of mount wiring 132b are not covered with heat radiation block substrate 141. This makes it possible to connect a wire to the part of mount wiring 132a or the part of mount wiring 132b exposed from heat radiation block substrate 141 for electrical connection. Furthermore, this makes it possible to connect a wire to heat radiation block wiring 142c disposed on the upper surface of heat radiation block substrate 141 for electrical connection. Hereinafter, cross sectional structures of semiconductor light emitting device 120 at a part at which semiconductor laser element 134a is disposed and at a part at which semiconductor laser element 134b is disposed will be described with reference to FIG. 8, FIG. 9, respectively.

As illustrated in FIG. 8, conductive via 145 is formed in heat radiation block substrate 141 and is disposed on semiconductor laser element 134a so as to penetrate through heat radiation block substrate 141. Conductive via 145 is constituted by a conductive material such as tungsten or copper which is embedded in a through hole formed in heat radiation block substrate 141. An upper surface of conductive via 145 is electrically connected to heat radiation block wiring 142c, and a lower surface of conductive via 145 is electrically connected to heat radiation block wiring 142a. Thus, heat radiation block wiring 142c and heat radiation block wiring 142a are electrically connected via conductive via 145. As illustrated in the drawing, heat radiation block wiring 142c and heat radiation block wiring 142a may be connected by using a plurality of conductive vias 145.

Heat radiation block wiring 142a is joined to an electrode at the upper side of semiconductor laser element 134a via heat radiation block solder layer 143a. Also, an electrode at the lower side of semiconductor laser element 134a is joined to mount wiring 132a via mount solder layer 133a. Thus, by applying a voltage between mount wiring 132a and heat radiation block wiring 142c that is connected to heat radiation block wiring 142a, current is supplied to semiconductor laser element 134a, so that it is possible for semiconductor laser element 134a to emit laser light.

Also, as illustrated in FIG. 9, heat radiation block wiring 142b that is disposed on semiconductor laser element 134b and in the lower surface of heat radiation block substrate 141 is joined to an electrode at the upper side of semiconductor laser element 134b via heat radiation block solder layer 143b. Furthermore, an electrode at the lower side of semiconductor laser element 134b is joined to mount wiring 132b via mount solder layer 133b. Thus, by applying a voltage between heat radiation block wiring 142b and mount wiring 132b, current is supplied to semiconductor laser element 134b, so that it is possible for semiconductor laser element 134b to emit laser light.

Furthermore, as illustrated in FIG. 8, FIG. 9, mount wiring 132a and heat radiation block wiring 142b are electrically connected via conductive post 144, so that semiconductor laser element 134a and semiconductor laser element 134b are connected in series. That is, by applying a voltage between heat radiation block wiring 142c and mount wiring 132b, it is possible to supply current to both semiconductor laser element 134a and semiconductor laser element 134b.

Figure 10:
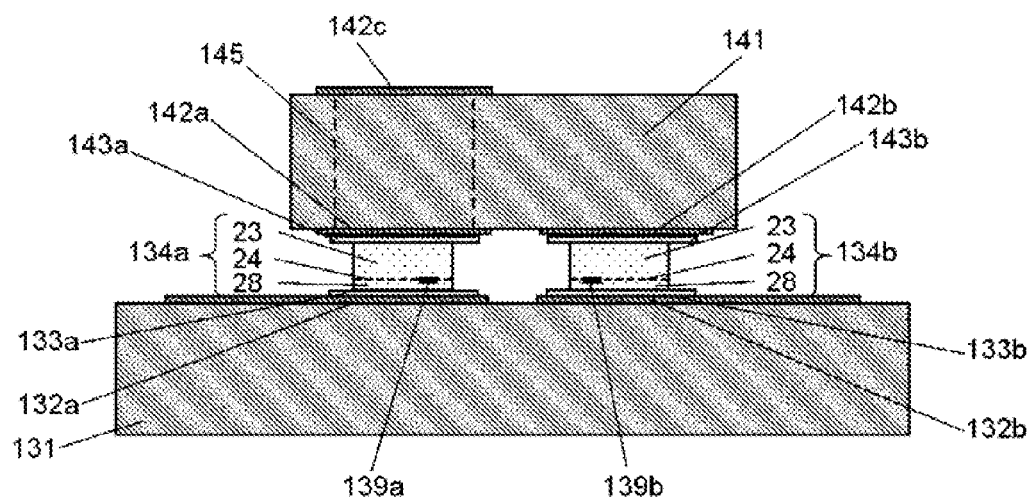
FIG. 10 is a front view illustrating the semiconductor light emitting device according to the first exemplary embodiment.

FIG. 10 is a front view illustrating the semiconductor light emitting device according to the first exemplary embodiment. As illustrated in FIG. 10, both semiconductor laser element 134a and semiconductor laser element 134b are joined to mount wiring 132a and mount wiring 132b of mount substrate 131, respectively, at a side of p-type layer 28 (junction down type implementation). Herein, each of semiconductor laser element 134a and semiconductor laser element 134b has n-type substrate 20 and the semiconductor layer including active layer 24 (n-type layer 23, active layer 24, and p-type layer 28 disposed on n-type substrate 20 in this order) formed on n-type substrate 20 as illustrated in FIG. 6. As described above, semiconductor laser element 134a is joined with mount wiring 132a at a side of the semiconductor layer, and semiconductor laser element 134b is joined with mount wiring 132b at a side of the semiconductor layer. Therefore, in a case of semiconductor laser element 134a and semiconductor laser element 134b using n-type substrate 20, there is not n-type substrate 20 between active layer 24 and p-side electrode 30, so that a distance from active layer 24 to mount substrate 131 is short. Thus, a heat dissipation path for dissipating heat generated in active layer 24 to semiconductor package 110, which is a heatsink, via mount substrate 131 can be short, so that it is possible to suppress temperature increase of semiconductor laser element 134a and semiconductor laser element 134b.

Furthermore, in order to make luminous point 139a of semiconductor laser element 134a and luminous point 139b of semiconductor laser element 134b locate close to each other, positions of the respective ridges are changed to locate close to each other. Thus, the interval between the luminous points can be not more than 100 µm, so that it is possible to improve combining efficiency with an optical system.

As described above, in the semiconductor light emitting device according to the present exemplary embodiment, by applying a voltage between mount wiring 132b and heat radiation block wiring 142c, current flows from mount wiring 132b to heat radiation block wiring 142c through semiconductor laser element 134b, heat radiation block wiring 142b, conductive post 144, mount wiring 132a, semiconductor laser element 134a, heat radiation block wiring 142a, and conductive via 145 in this order. That is, the semiconductor light emitting device of the exemplary embodiment makes it possible to flow current in the two semiconductor light emitting elements (semiconductor light emitting element 134a and semiconductor light emitting element 134b) in series as well as dispose the two semiconductor light emitting elements so as to locate the electrodes having the same polarity (P-type) of the respective semiconductor laser elements near the heat sink.

As described above, the problem that a load is concentrated in one semiconductor light emitting device due to connecting a plurality of semiconductor laser elements in parallel can be solved. And thus reliability of the semiconductor light emitting device of high output using a plurality of semiconductor laser elements can be improved.

Furthermore, since the two semiconductor laser elements (semiconductor laser element 134a, semiconductor laser element 134b) are also connected to heat radiation block 140, heat can be radiated not only to mount section 130 but also to heat radiation block 140. Furthermore, since the heat transmitted to heat radiation block 140 can be radiated to mount section 130 via conductive post 144, temperature increase of the semiconductor laser elements can be drastically suppressed. Thus, it is possible to improve reliability of the semiconductor light emitting device.

Furthermore, since luminous point 139a and luminous point 139b can be disposed in a plane parallel to the implementation surface of semiconductor package 110 and semiconductor light emitting device 120, and the interval between the luminous points can be shortened, it is possible to improve coupling efficiency with the optical system. Therefore, it is possible to secure required light quantity with smaller input power, so that temperature increase of the semiconductor laser elements can be suppressed. Thus, it is possible to improve reliability of the semiconductor light emitting device. As descried above, the semiconductor light emitting device having high reliability even in high-power operation can be provided.

Second Exemplary Embodiment

Figure 11:
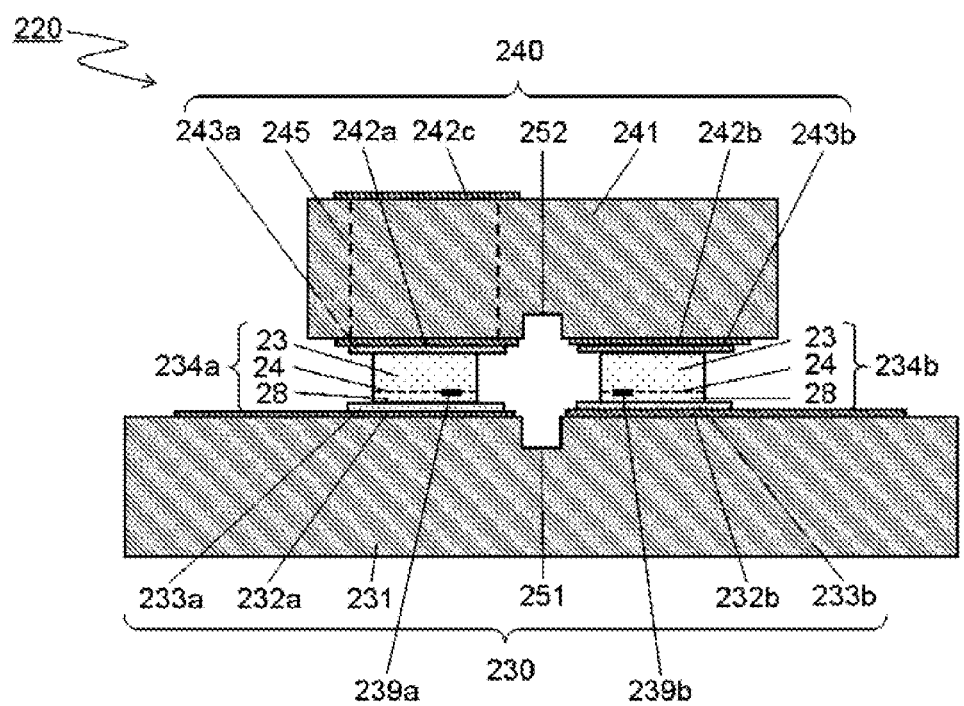
FIG. 11 is a front view illustrating a semiconductor light emitting device according to a second exemplary embodiment.
Figure 12:
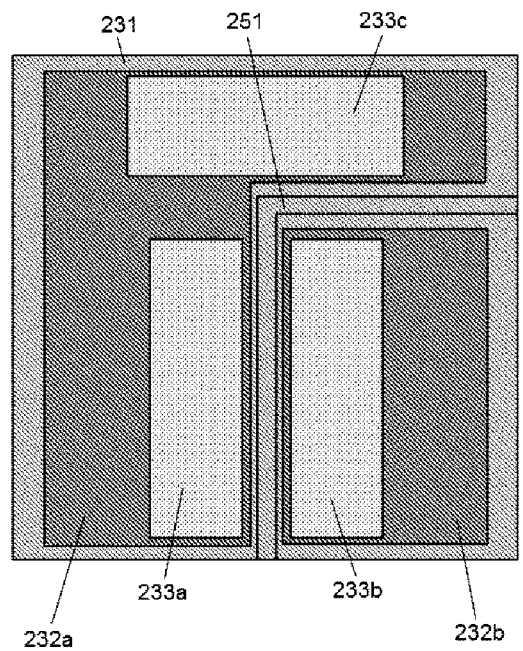
FIG. 12 is a top view illustrating a mount section according to the second exemplary embodiment.
Figure 13:
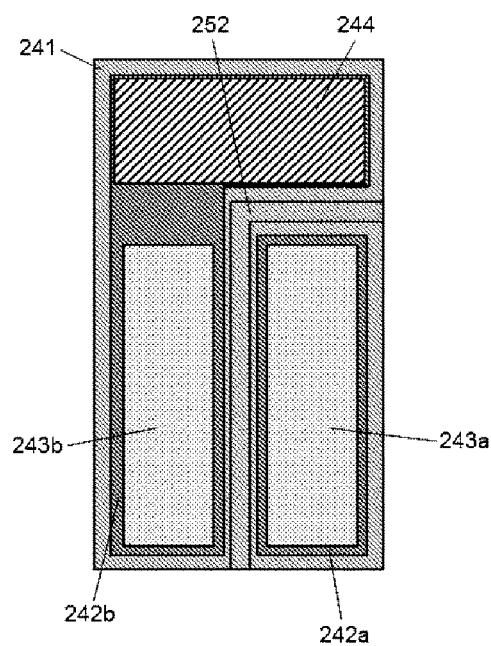
FIG. 13 is a bottom view illustrating a heat radiation block according to the second exemplary embodiment.

A structure of a semiconductor light emitting device according to a second exemplary embodiment will be described with reference to FIG. 11 to FIG. 13. FIG. 11 is a front view illustrating the semiconductor light emitting device according to the second exemplary embodiment. FIG. 12 is a top view illustrating a mount section according to the second exemplary embodiment, and FIG. 13 is a bottom view illustrating a heat radiation block according to the second exemplary embodiment. Note that the structure same as that of the first exemplary embodiment will not be described, and a structure different from that of the first exemplary embodiment will be mainly described.

As illustrated in FIG. 11, in semiconductor light emitting device 220 of the present exemplary embodiment, mount groove 251 is provided between mount wiring 232a and mount wiring 232b of mount section 230. Furthermore, heat radiation block groove 252 is provided between heat radiation block wiring 242a and heat radiation block wiring 242b of heat radiation block 240. Other structure is the same as that of semiconductor light emitting device 120 of the first exemplary embodiment.

As described in FIG. 12, mount groove 251 has a shape bent in an L shape along an outline of mount wiring 232a having an L shape. In other words, mount groove 251 is entirely formed over a gap between mount wiring 232a and mount wiring 232b.

Also, as illustrated in FIG. 13, heat radiation block groove 252 has a shape bent in an L shape along an outline of heat radiation block wiring 242b having an L shape. In other words, heat radiation block groove 252 is entirely formed over a gap between heat radiation block wiring 242a and heat radiation block wiring 242b.

Herewith, in semiconductor light emitting device 220 of the present exemplary embodiment, even when mount solder layer 233a for joining semiconductor laser element 234a to mount section 230 is widened to protrude sideways, mount solder layer 233a is suppressed to be in contact with mount semiconductor layer 232b by mount groove 251 provided between mount wiring 232a and mount wiring 232b. Likewise, mount solder layer 233b is suppressed to be in contact with mount wiring 232a by mount groove 251.

Also, even when heat radiation block solder layer 243a for joining semiconductor laser element 234a to heat radiation block 240 is widened to protrude sideways, heat radiation block solder layer 243a is suppressed to be in contact with heat radiation block wiring 242b by heat radiation block groove 252 provided between heat radiation block wiring 242a and heat radiation block wiring 242b. Likewise, heat radiation block solder layer 243b is suppressed to be in contact with heat radiation block wiring 242a by heat radiation block groove 252.

As described above, leakage current due to an electrical short circuit between semiconductor laser element 234a and semiconductor laser element 234b can be suppressed. Thus, it is possible to improve reliability of the semiconductor light emitting device and yield during manufacture of the semiconductor light emitting device. Other advantageous effects are the same as those of the first exemplified embodiment.

Third Exemplary Embodiment

Figure 14:
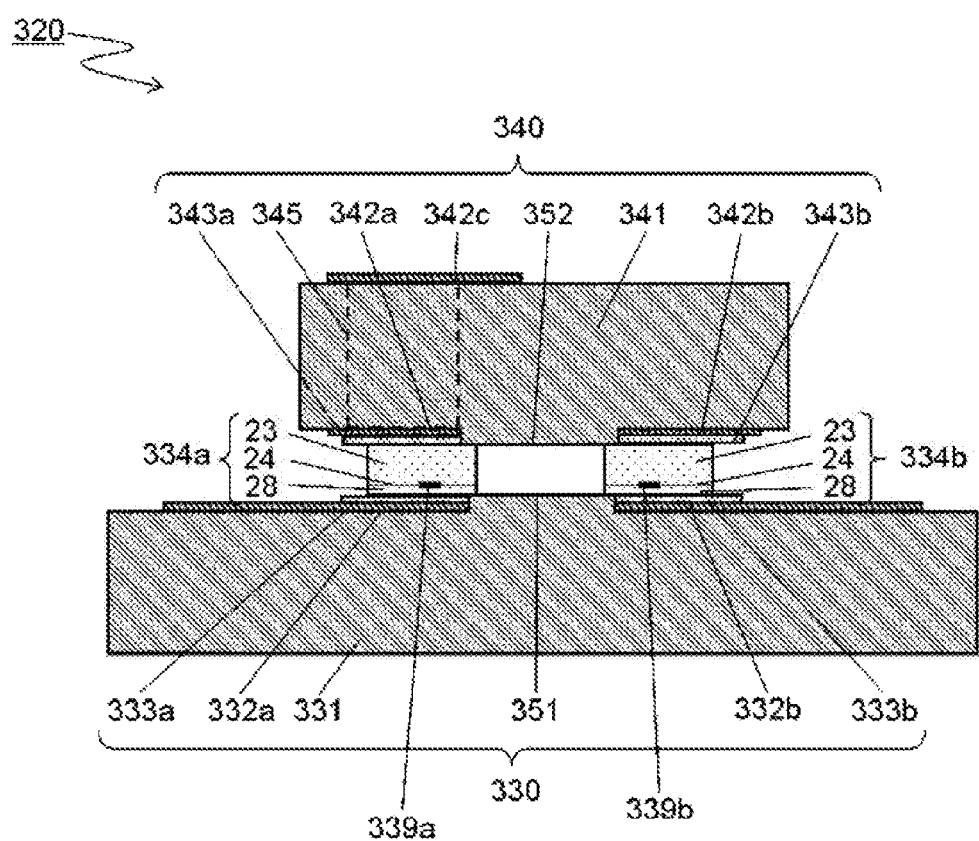
FIG. 14 is a front view illustrating a semiconductor light emitting device according to a third exemplary embodiment.

A structure of a semiconductor light emitting device according to a third exemplary embodiment will be described with reference to FIG. 14. FIG. 14 is a front view illustrating the semiconductor light emitting device according to the third exemplary embodiment. Note that the structure same as that of the first exemplary embodiment will not be described, and a structure different from that of the first exemplary embodiment will be mainly described.

As illustrated in FIG. 14, in semiconductor light emitting device 320 of the present exemplary embodiment, mount protrusion 351 is provided between mount wiring 332a and mount wiring 332b of mount section 330. Similar to mount grove 251 in semiconductor light emitting device 220 of the second exemplary embodiment, mount protrusion 351 has a shape bent in an L shape (not shown) along an outline of mount wiring 332a having an L shape. In other words, mount protrusion 351 is entirely formed over a gap between mount wiring 332a and mount wiring 332b.

Furthermore, a height of mount protrusion 351 is set to be substantially equal to a value that is a sum of a height of mount wiring 332a and a height of mount solder layer 333a when semiconductor laser element 334a is implemented on mount section 330, or a sum of a height of mount wiring 332b and a height of mount solder layer 333b when semiconductor laser element 334b is implemented on mount section 330. Also, a width of mount protrusion 351 is larger than a gap between semiconductor laser element 334a and semiconductor laser element 334b. And a part of semiconductor laser element 334a and a part of semiconductor laser element 334b are placed on mount protrusion 351.

Also, heat radiation block protrusion 352 is provided between heat radiation block wiring 342a and heat radiation block wiring 342b of heat radiation block 340. Heat radiation block protrusion 352 has a shape bent in an L shape along an outline of heat radiation block wiring 342b having an L shape similar to heat radiation block groove 252 in semiconductor light emitting device 220 of the second exemplary embodiment. In other words, heat radiation block protrusion 352 is entirely formed over a gap between heat radiation block wiring 342a and heat radiation block wiring 342b.

Furthermore, a height of heat radiation block protrusion 352 is set to be substantially equal to a value that is a sum of a height of heat radiation block wiring 342a and a height of heat radiation block solder layer 343a when heat radiation block 340 is implemented on semiconductor laser element 334a, or a sum of a height of heat radiation block wring 342b and a height of heat radiation block solder layer 343b when heat radiation block 340 is implemented on semiconductor laser element 334b. Also, a width of heat radiation block protrusion 352 is larger than a gap between semiconductor laser element 334a and semiconductor laser element 334b. And heat radiation block protrusion 352 is placed on a part of semiconductor laser element 334a and a part of semiconductor laser element 334b. Note that other structures are the same as those of semiconductor light emitting device 120 of the first exemplary embodiment.

Herewith, in semiconductor light emitting device 320 of the present exemplary embodiment, even when mount solder layer 333a for joining semiconductor laser element 334a to mount section 330 is widened to protrude sideways, mount solder layer 333a is suppressed to be in contact with mount wiring 332b by mount protrusion 351 provided between mount wiring 332a and mount wiring 332b. Likewise, mount solder layer 333b is suppressed to be in contact with mount wiring 332a by mount protrusion 351.

Also, even when heat radiation block solder layer 343a for joining semiconductor laser element 334a to heat radiation block 340 is widened to protrude sideways, heat radiation block solder layer 343a is suppressed to be in contact with heat radiation block wiring 342b by heat radiation block protrusion 352 provided between heat radiation block wiring 342a and heat radiation block wiring 342b. Likewise, heat radiation block solder layer 343b is suppressed to be in contact with heat radiation block wiring 342a by heat radiation block protrusion 352.

As described above, leakage current due to an electrical short circuit between semiconductor laser element 234a and semiconductor laser element 234b can be suppressed. Thus it is possible to improve reliability of the semiconductor light emitting device and yield during manufacture of the semiconductor light emitting device.

Also, since a part of semiconductor laser element 334a and a part of semiconductor laser element 334b are placed on mount protrusion 351, implementation can be performed while keeping a constant distance from a bottom surface of mount section 330 to luminous point 339a of semiconductor laser element 334a and luminous point 339b of semiconductor laser element 334b. Therefore, it is possible to reduce positional variation of the luminous points with respect to semiconductor package 110, thus it is easy to design an optical system. Other advantageous effects are the same as those of the first exemplified embodiment.

Fourth Exemplary Embodiment

Figure 15:
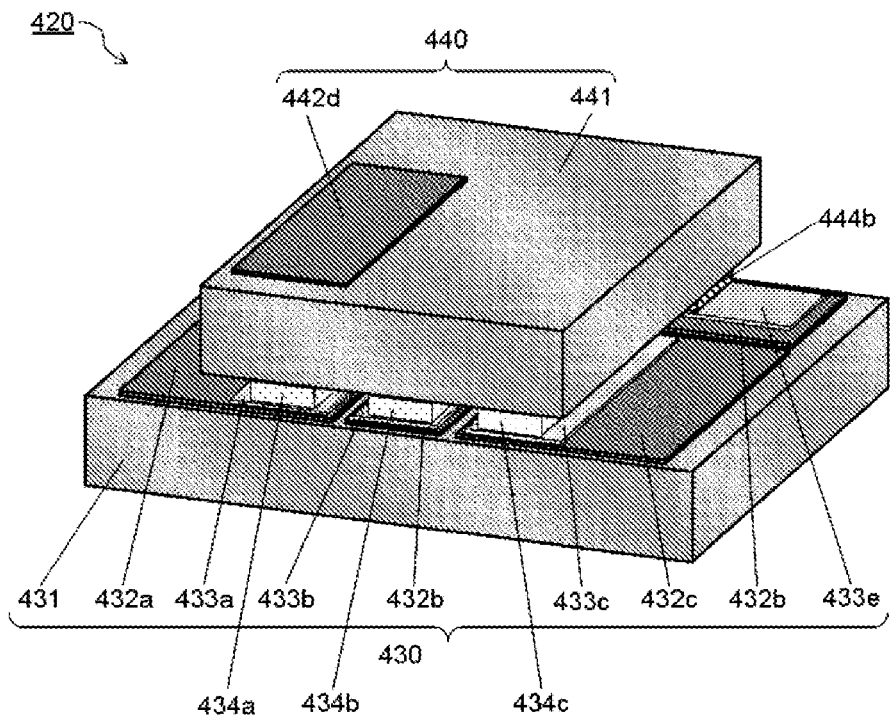
FIG. 15 is a front side perspective view illustrating a semiconductor light emitting device according to a fourth exemplary embodiment.
Figure 16:
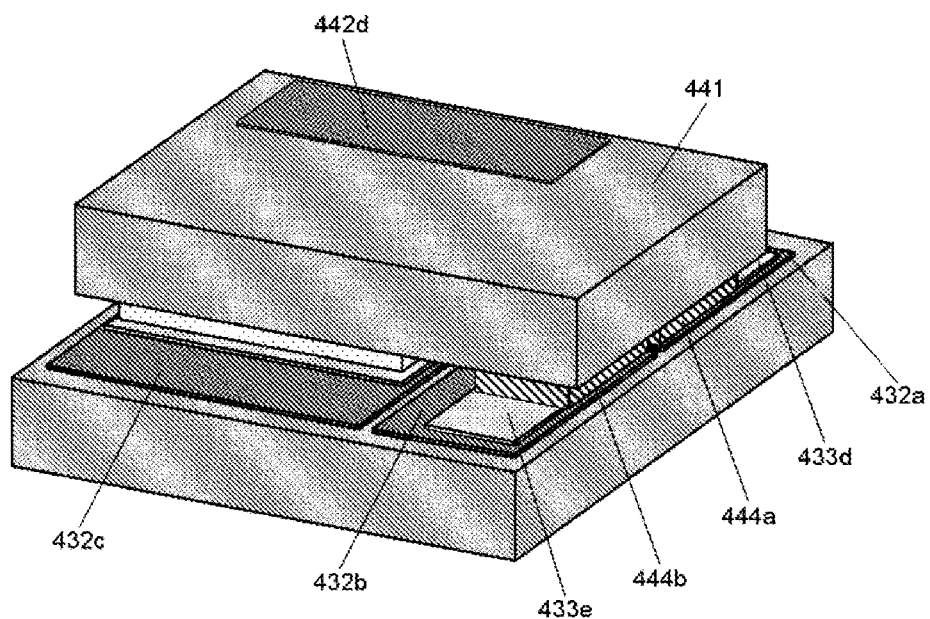
FIG. 16 is a back side perspective view illustrating the semiconductor light emitting device according to the fourth exemplary embodiment.
Figure 17:
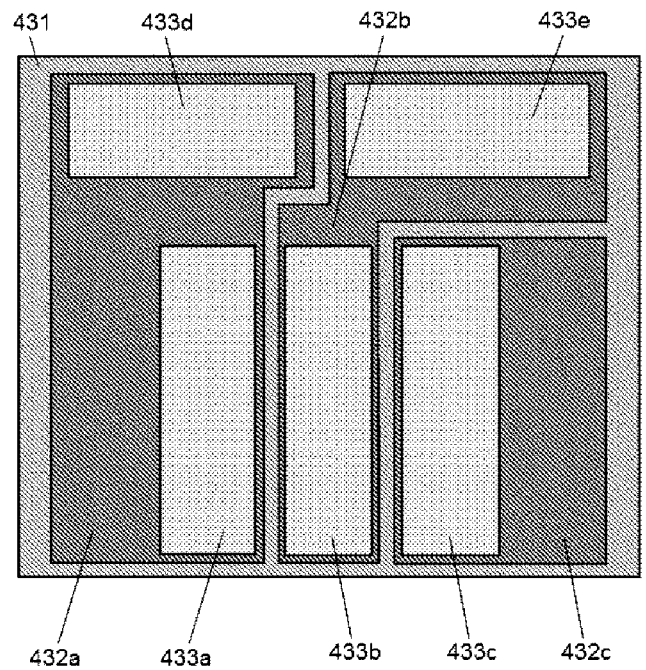
FIG. 17 is a top view illustrating a mount section according to the fourth exemplary embodiment.
Figure 18:
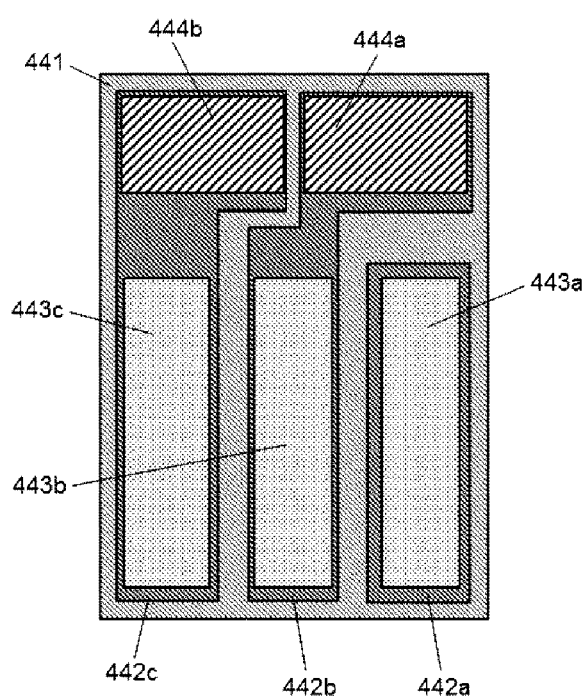
FIG. 18 is a bottom view illustrating a heat radiation block according to the fourth exemplary embodiment.
Figure 19:
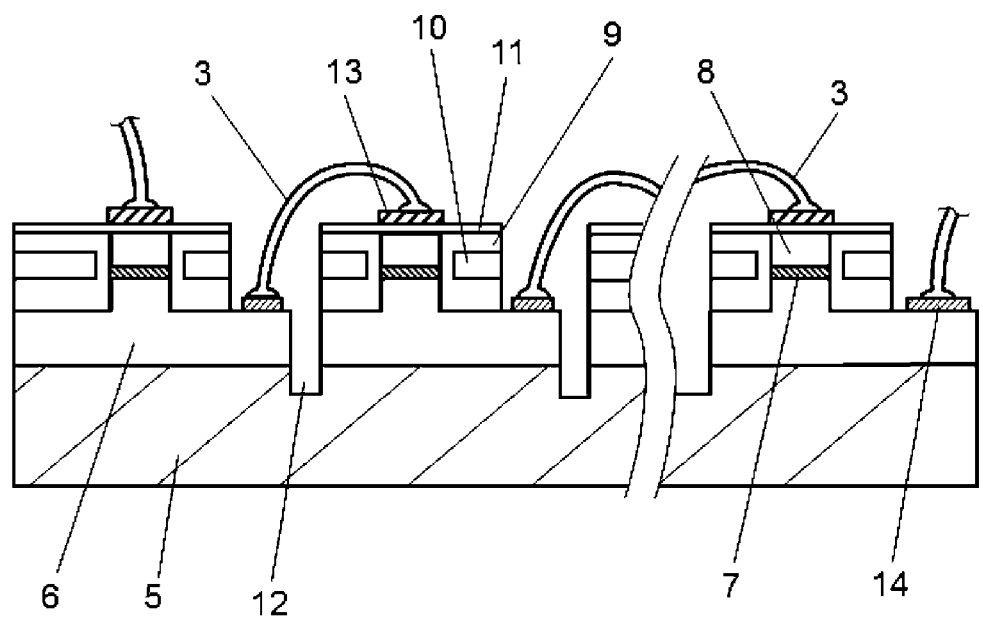
FIG. 19 is a diagram illustrating a structure of a conventional device.

A structure of a semiconductor light emitting device according to a fourth exemplary embodiment will be described with reference to FIG. 15 to FIG. 18. FIG. 15 is a front side perspective view illustrating the semiconductor light emitting device according to the fourth exemplary embodiment, and FIG. 16 is a back side perspective view illustrating the semiconductor light emitting device according to the fourth exemplary embodiment. FIG. 17 is a top view illustrating a mount section according to the fourth exemplary embodiment, and FIG. 18 is a bottom view illustrating a heat radiation block according to the fourth exemplary embodiment. Note that the structure same as that in the first exemplary embodiment will not be described, and a structure different from that of the first exemplary embodiment will be mainly described.

As illustrated in FIG. 15, semiconductor light emitting device 420 according to the present exemplary embodiment has a structure in which three semiconductor laser elements (semiconductor laser element 434a, semiconductor laser element 434b, and semiconductor laser element 434c) are sandwiched between mount section 430 and heat radiation block 440. Mount section 430 has mount substrate 431 and mount wirings (mount wiring 432a, mount wiring 432b, and mount wiring 432c) formed on an upper surface of mount substrate 431. Furthermore, heat radiation block 440 has heat radiation block substrate 441, heat radiation block wirings (heat radiation block wiring 442a, heat radiation block wiring 442b, and heat radiation block wiring 442c to be described below) formed on a lower surface of heat radiation block substrate 441, and a heat radiation block wiring (heat radiation block wiring 442d) formed on an upper surface of heat radiation block substrate 441. The materials of mount substrate 431, the mount wirings, heat radiation block substrate 441, and the heat radiation block wirings are the same as those in the first exemplary embodiment. Note that other structures are the same as those of semiconductor light emitting device 120 of the first exemplary embodiment.

A wiring structure on upper surface of mount section 430 and lower surface of heat radiation block 440 will be described in detail with reference to FIG. 17 and FIG. 18, respectively. As illustrated in FIG. 17, by patterning a metal layer formed on a surface (upper surface) of mount substrate 431, mount wiring 432a having an L shape, mount wiring 432c having a rectangular shape, and mount wiring 432b located between mount wiring 432a and mount wiring 432c are formed. Mount wiring 432b has an L shape in which a part thereof is cut out. Mount wiring 432a has an L shape whose width at the front side is small and whose width at the back side is large. Also, mount wiring 432b has an L shape whose width at the front side is small and whose width at the back side is large, one corner of which is cut out. Herein, the lower side in the drawing is the front side, and the upper side of the drawing is the back side. Mount solder layer 433a for joining semiconductor laser element 434a is formed on mount wiring 432a at the front side. Also, mount solder layer 433d for joining conductive post 444a (described below) is formed on mount wiring 432a at the back side. Mount solder layer 433b for joining semiconductor laser element 434b is formed on mount wiring 432b at the front side. Also, mount solder layer 433e for joining conductive post 444b (described below) is formed on mount wiring 432b at the back side. Mount solder layer 433c for joining semiconductor laser element 434c is formed on mount wiring 432c.

Furthermore, as illustrated in FIG. 18, by patterning a metal layer formed on a surface (lower surface) of heat radiation block substrate 441, heat radiation block wiring 442a having a rectangular shape, heat radiation block wiring 442c having an L shape, and heat radiation block wiring 442b located between heat radiation block wiring 442a and heat radiation block wiring 442c are formed. Heat radiation block wiring 442b has an L shape in which a part thereof is cut out. Heat radiation block wiring 442c has an L shape whose width at the front side is small and whose width at the back side is large. Also, heat radiation block wiring 442b has an L whose width at the front side is small and whose width at the back side is large, one corner of which is cut out. Herein, the lower side in the drawing is the front side, and the upper side in the drawing is the back side. Heat radiation block solder layer 443c for joining semiconductor laser element 434c is formed on heat radiation block wiring 442c at the front side. Also, conductive post 444b is disposed on heat radiation block wiring 442c at the back side. Heat radiation block solder layer 443b for joining semiconductor laser element 434b is formed on heat radiation block wiring 442b at the front side. Also, conductive post 444a is disposed on heat radiation block wiring 442b at the back side. Heat radiation block solder layer 443a for joining semiconductor laser element 434a is formed on heat radiation block wiring 442a.

As illustrated in FIG. 15, semiconductor laser element 434a, semiconductor laser element 434b, and semiconductor laser element 434c are implemented on mount section 430 with their laser emission end surfaces being oriented toward the front side. Specifically, the lower surface of semiconductor laser element 434a is electrically connected to and mechanically fixed to mount wiring 432a by mount solder layer 433a. Also, the lower surface of semiconductor laser element 434b is electrically connected to and mechanically fixed to mount wiring 432b by mount solder layer 433b. Also, the lower surface of semiconductor laser element 434c is electrically connected to and mechanically fixed to mount wiring 432c by mount solder layer 433c.

On the upper surface of mount section 430, semiconductor laser element 434a, semiconductor laser element 434b, and semiconductor laser element 434c are disposed at the front side, and conductive post 444a and conductive post 444b are disposed at the back side. As illustrated in FIG. 16, by mount solder layer 433d, conductive post 444a is electrically connected to and mechanically fixed to mount wiring 432a, which is extending to the back side. Also, by mount solder layer 433e, conductive post 444b is electrically connected to and mechanically fixed to mount wiring 432b, which is extending to the back side. The material of conductive post 444a and conductive post 444b are the same as that in the first exemplary embodiment.

Heat radiation block 440 is disposed on semiconductor laser element 434a, semiconductor laser element 434b, and semiconductor laser element 434c. And heat radiation block wiring 442a, heat radiation block wiring 442b, and heat radiation block wiring 442c are respectively joined with semiconductor laser element 434a, semiconductor laser element 434b, and semiconductor laser element 434c. Specifically, the upper surface of semiconductor laser element 434a is electrically connected to and mechanically fixed to heat radiation block wiring 442a by heat radiation block solder layer 443a. Also, the upper surface of semiconductor laser element 434b is electrically connected to and mechanically fixed to heat radiation block wiring 442b by heat radiation block solder layer 443b. Also, the upper surface of semiconductor laser element 434c is electrically connected to and mechanically fixed to heat radiation block wiring 442c by heat radiation block solder layer 443c.

On the lower surface of heat radiation block 440, semiconductor laser element 434a, semiconductor laser element 434b, and semiconductor laser element 434c are disposed at the front side, and conductive post 444a and conductive post 444b are disposed at the back side. Conductive post 444a is electrically connected to and mechanically fixed to heat radiation block wiring 442b, which is extending to the back side. Thus, mount wiring 432a and heat radiation block wiring 442b are electrically connected via conductive post 444a. Also, conductive post 444b is electrically connected to and mechanically fixed to heat radiation block wiring 442c, which is extending to the back side. Thus, mount wiring 432b and heat radiation block wiring 442c are electrically connected via conductive post 444b.

Furthermore, heat radiation block wiring 442a is electrically connected to heat radiation block wiring 442d formed on the upper surface of heat radiation block substrate 441 via a conductive via (not shown) penetrating through heat radiation block substrate 441. Note that a structure of the conductive via is the same as that in the first exemplary embodiment.

Also, the structure of each of semiconductor laser element 434a, semiconductor laser element 434b, and semiconductor laser element 434c is the same as that in the first exemplary embodiment.

As described above, in semiconductor light emitting device 420 of the exemplary embodiment, it is possible to connect the three semiconductor laser elements (semiconductor laser element 434a, semiconductor laser element 434b, and semiconductor laser element 434c) in series in a state where the electrodes having the same polarity (p-type) of the three semiconductor laser elements are joined to mount section 430 similar to the first exemplary embodiment. That is, by applying a voltage between mount wiring 432c and heat radiation block wiring 442d, it is possible to simultaneously emit laser light from the three semiconductor laser elements (semiconductor laser element 434a, semiconductor laser element 434b, and semiconductor laser element 434c). Other advantageous effects are the same as those of the first exemplified embodiment.

As described above, the content of the present disclosure is described using the first to fourth exemplary embodiments, but the present disclosure is not limited to the exemplary embodiments. For example, in the above-described exemplary embodiments, the heat radiation block wirings respectively formed on the upper surface and the lower surface of the heat radiation block substrate are electrically connected to each other by using the conductive via penetrating through the heat radiation block substrate. The heat radiation block wirings on the upper surface and the lower surface, however, may be electrically connected to each other by a conductive film formed on a side surface of the heat radiation block substrate instead of the conductive via.

Furthermore, although the above-described exemplary embodiment illustrates a case where a number of semiconductor laser elements connected in series is two or three, four or more semiconductor laser elements can be connected in series by the same structure.

The present disclosure can be applied to a high output light source or the like used for an industrial lighting device such as a vehicle lighting device, a spot lighting device in a factory or a gym, or a shop lighting device.

What is claimed is:

1. A semiconductor light emitting device comprising:
a mount section connected to a heat sink, the mount section having an upper surface and a lower surface, the mount section having an insulating property;
first wirings disposed on the upper surface of the mount section, the first wirings being made of metal, a plurality of semiconductor laser elements disposed on the first wirings on the upper surface of the mount section;

a heat radiation block disposed on the plurality of semiconductor laser elements, the heat radiation block having an upper surface and a lower surface, the heat radiation block having an insulating property, second wirings disposed on the lower surface of the heat radiation block, the second wirings being made of a metal, a part of the second wirings being electrically connected to the first wirings; and a conductive post disposed between the mount section and the heat radiation block, the conductive post being electrically connected to the first wirings and the second wirings, wherein:

each of the plurality of semiconductor laser elements is sandwiched by the upper surface of the mount section and the lower surface of the heat radiation block, and by electrically connecting the first wirings and the second wirings to each of the plurality of semiconductor laser elements, the plurality of semiconductor laser elements are connected in series, and have a same polarity with each other at a side that each of the plurality of semiconductor laser elements is connected to the first wirings.

2. The semiconductor light emitting device according to claim 1, wherein a joint part of each of the plurality of the semiconductor laser elements has a p-type polarity, the joint part joining with the first wirings.

3. The semiconductor light emitting device according to claim 1, wherein the plurality of semiconductor laser elements have respective luminous points disposed at a same distance from an upper surface of the first wirings with each other.

4. The semiconductor light emitting device according to claim 1, wherein:

a third wiring is disposed on an upper surface of the heat radiation block, the third wiring being made of a metal, the second wirings and the third wiring are electrically connected to each other, and the plurality of semiconductor laser elements are capable to be supplied electricity via the third wiring.

5. The semiconductor light emitting device according to claim 4, wherein:

the heat radiation block includes a via made of a conductive material, and the via electrically connects the second wirings and the third wiring.

6. The semiconductor light emitting device according to claim 1, wherein the plurality of semiconductor laser elements include a first semiconductor laser element and a second semiconductor laser element, a luminous point of the first semiconductor laser element is located closer to the second semiconductor laser element than a center line of the first semiconductor laser element is to the second semiconductor laser element, the center line of the first semiconductor laser element extending in a thickness direction of the first semiconductor laser element, and a luminous point of the second semiconductor laser element is located closer to the first semiconductor laser element than a center line of the second semiconductor laser element is to the first semiconductor laser element, the center line of the second semiconductor laser element extending in a thickness direction of the second semiconductor laser element.

7. The semiconductor light emitting device according to claim 1, wherein two semiconductor laser elements disposed on the mount section among the plurality of the semiconductor laser elements have respective luminous points separated at an interval of not more than 100 µm.

8. The semiconductor light emitting device according to claim 1, wherein each of the plurality of semiconductor laser elements includes a nitride semiconductor.

9. The semiconductor light emitting device according to claim 1, wherein each of the plurality of semiconductor laser elements includes a substrate and a semiconductor layer including an active layer formed on the substrate, the semiconductor layer being joined to the first wirings.

10. The semiconductor light emitting device according to claim 1, wherein a mount groove is between the first wirings in the mount section.

11. The semiconductor light emitting device according to claim 1, wherein a heat radiation block groove is between the second wirings in the heat radiation block.

12. The semiconductor light emitting device according to claim 1, wherein a mount protrusion is between the first wirings in the mount section.

13. The semiconductor light emitting device according to claim 1, wherein a heat radiation block protrusion is between the second wirings in the heat radiation block.

14. A semiconductor light emitting device comprising:

a mount section connected to a heat sink, the mount section having an upper surface and a lower surface, the mount section having an insulating property;

a first mount wiring and a second mount wiring disposed on the upper surface of the mount section, the first mount wiring and the second mount wiring being made of metal, a first semiconductor laser element disposed on the first mount wiring on the upper surface of the mount section and a second semiconductor laser element disposed on the second mount wiring on the upper surface of the mount section;

a heat radiation block disposed on the plurality of semiconductor laser elements, the heat radiation block having an upper surface and a lower surface, the heat radiation block having an insulating property, and a first heat radiation block wiring and a second heat radiation block wiring disposed on the lower surface of the heat radiation block, the first heat radiation block wiring and the second heat radiation block wiring being made of a metal, wherein:

the first semiconductor laser element is sandwiched by the first mount wiring and the second heat radiation block wiring, the second semiconductor laser element is sandwiched by the second mount wiring and the first heat radiation block wiring, a conductive post is sandwiched by the first mount wiring and the first heat radiation block wiring, the first semiconductor laser element is electrically connected to the first mount wiring and the second heat radiation block wiring, the second semiconductor laser element is electrically connected to the second mount wiring and the first heat radiation block wiring, the conductive post is electrically connected to the first mount wiring and the first heat radiation block wiring, the first semiconductor laser element and the second semiconductor laser element are connected in series, and the first semiconductor laser element at a side that the first semiconductor laser element is connected to the first mount wiring has a same polarity with the second semiconductor laser element at a side that the second semiconductor laser element is connected to the second mount wiring.

15. The semiconductor light emitting device according to claim 14, wherein a joint part of each of the plurality of the semiconductor laser elements has a p-type polarity, the joint part joining with the first mount wiring and the second mount wiring.

16. The semiconductor light emitting device according to claim 14, a film thickness of each of the first mount wiring and the second mount wiring is no less than 50 μm and not more than 300 μm.

17. The semiconductor light emitting device according to claim 14, wherein the plurality of semiconductor laser elements include a first semiconductor laser element and a second semiconductor laser element, and the conductive post overlaps the first semiconductor laser element or the second semiconductor laser element in the front view.

18. The semiconductor light emitting device according to claim 14, wherein the first mount wiring has an L shape and the second mount wiring has a rectangular shape.

* * * * *